(12) United States Patent
Tsai

(10) Patent No.: US 9,543,757 B2
(45) Date of Patent: Jan. 10, 2017

(54) ESD PROTECTION CIRCUITS AND METHODS

(71) Applicant: Taiwan Semiconductor Manufacturing Co., Ltd., Hsin-Chu (TW)

(72) Inventor: Ming-Hsien Tsai, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 191 days.

(21) Appl. No.: 14/445,138

(22) Filed: Jul. 29, 2014

(65) Prior Publication Data

US 2016/0036218 A1    Feb. 4, 2016

Related U.S. Application Data

(63) Continuation-in-part of application No. 13/337,463, filed on Dec. 27, 2011, now Pat. No. 8,854,778.

(51) Int. Cl.
*H02H 9/00* (2006.01)
*H02H 9/04* (2006.01)
*H01L 27/02* (2006.01)

(52) U.S. Cl.
CPC .......... *H02H 9/046* (2013.01); *H01L 27/0288* (2013.01)

(58) Field of Classification Search
CPC ...................................... H02H 9/046
USPC .......................................... 361/56
See application file for complete search history.

(56) References Cited

U.S. PATENT DOCUMENTS

| 3,155,927 A | 11/1964 | True |
| 5,309,428 A | 5/1994 | Copley et al. |
| 5,754,381 A | 5/1998 | Ker |
| 7,005,939 B2 | 2/2006 | Zerbe et al. |
| 7,192,823 B2 | 3/2007 | Kao |
| 7,265,433 B2 * | 9/2007 | Pillai ...................... H01L 24/05 257/531 |
| 7,894,173 B2 | 2/2011 | Deng et al. |
| 8,854,778 B2 * | 10/2014 | Chu ...................... H02H 9/046 361/111 |
| 2006/0151851 A1 | 7/2006 | Pillai et al. |
| 2011/0279935 A1 | 11/2011 | Iwasa et al. |

OTHER PUBLICATIONS

Linten, D. et al., "A 4.5kV HBM, 300 V CDM, 1.2 kV HMM ESD Protected DC-to-16.1 GHz Wideband LNA in 90 nm CMOS", EOS/ESD Symposium, 2009, 6 pages.
Galal, S. et al., "Broadband ESD Protection Circuits in CMOS Technology", IEEE Journal of Solid-State Circuits, Brief Papers, Dec. 2003, 38(12):2334-2340.

* cited by examiner

*Primary Examiner* — Stephen W Jackson
(74) *Attorney, Agent, or Firm* — Duane Morris LLP

(57) ABSTRACT

An electrostatic discharge (ESD) protection circuit includes a first inductor coupled to an input node configured to receive an input signal and to an output node. A second inductor is coupled to the input node and to a first ESD protection device, and a third inductor is coupled to the output node and to a second ESD protection device.

22 Claims, 15 Drawing Sheets

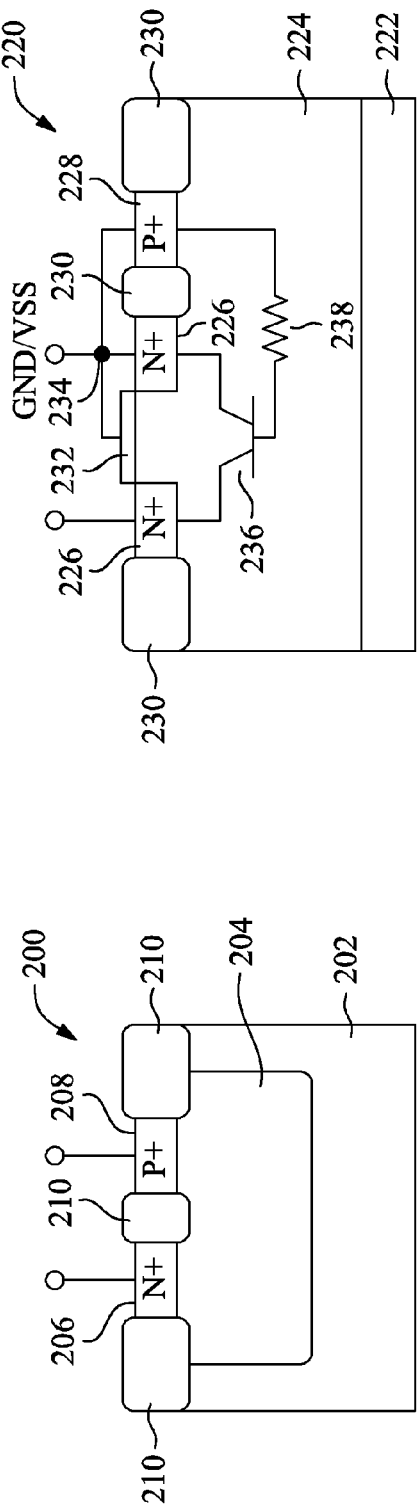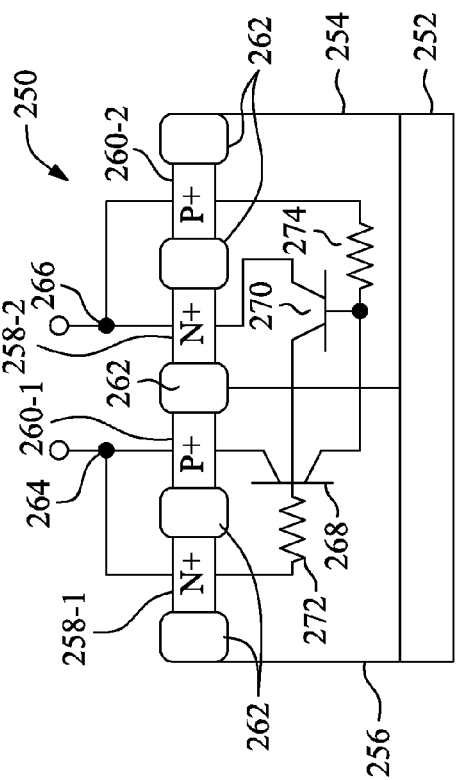
FIG. 3A
FIG. 3B
FIG. 3C

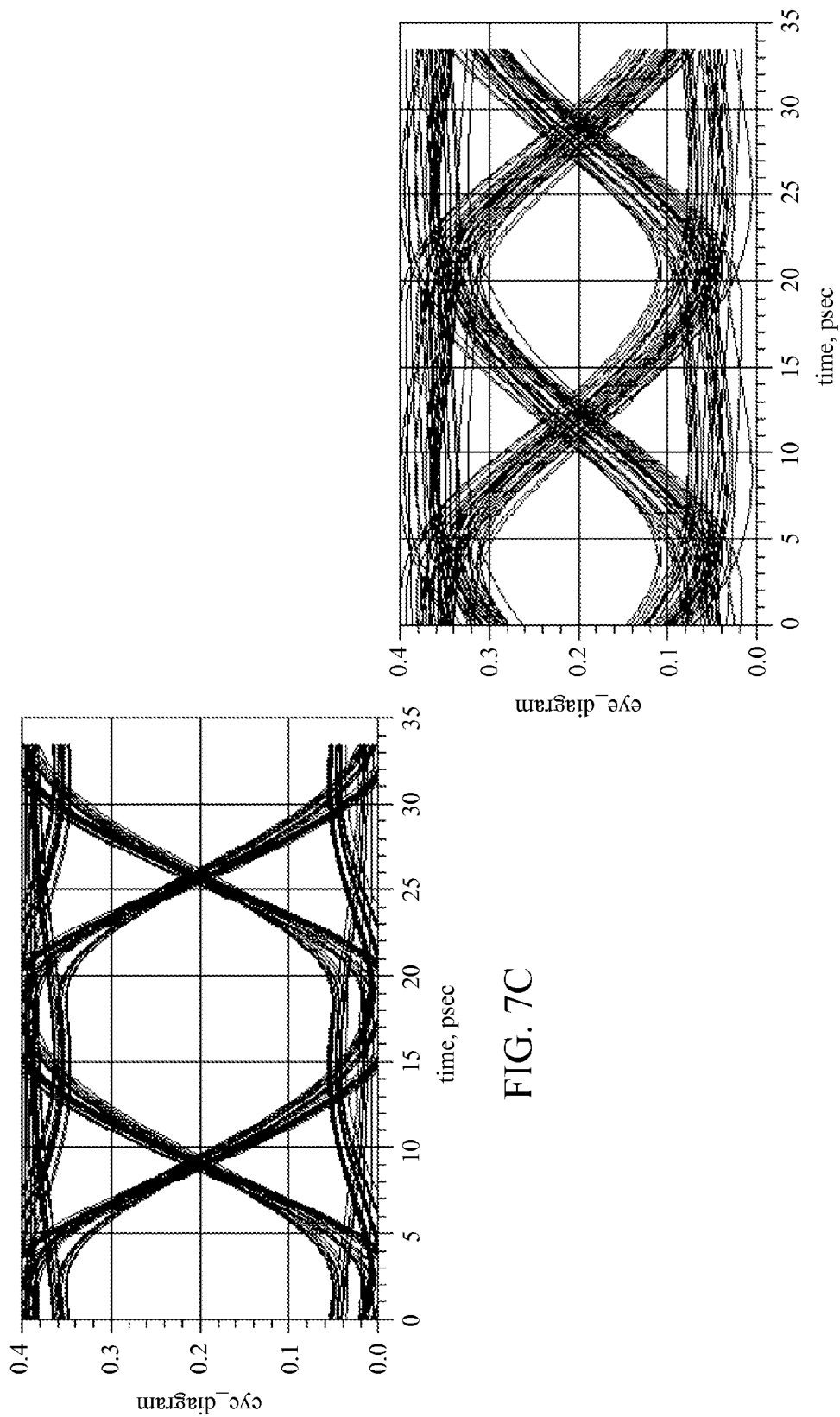

ESD PROTECTION CIRCUITS AND METHODS

CROSS-REFERENCE TO RELATED APPLICATIONS

This application is a continuation-in-part of U.S. patent application Ser. No. 13/337,463, filed Dec. 27, 2011, now U.S. Pat. No. 8,854,778, the entirety of which is incorporated by reference herein.

FIELD OF DISCLOSURE

The disclosed systems and methods relate to integrated circuits. More specifically, the disclosed systems and methods relate to integrated circuits with improved electrostatic discharge (ESD) protection circuits.

BACKGROUND

With the continued miniaturization of integrated circuit (IC) devices, the current trend is to produce integrated circuits having shallower junction depths, thinner gate oxides, lightly-doped drain (LDD) structures, shallow trench isolation (STI) structures, and self-aligned silicide (salicide) processes, all of which are used in advanced sub-quarter-micron complementary metal oxide semiconductor (CMOS) technologies. All of these processes cause the related CMOS IC products to become more susceptible to damage due to ESD events. Therefore, ESD protection circuits are built onto the chip to protect the devices and circuits on the IC from ESD damage. ESD protection circuits are typically provided for input/output ("I/O") pads. However, conventional ESD protection circuits cause undesirable signal losses.

BRIEF DESCRIPTION OF THE DRAWINGS

FIG. 3A-3C illustrate embodiments of protection devices in accordance with the ESD protection circuit illustrated in FIG. 2.

FIGS. 7A-7D are eye diagrams generated in response to a signal received at a second data rate when ESD protection devices have various capacitances.

DETAILED DESCRIPTION

This description of the exemplary embodiments is intended to be read in connection with the accompanying drawings, which are to be considered part of the entire written description.

The improved electrostatic discharge ("ESD") circuits disclosed herein advantageously protect high-speed circuits (e.g., circuits having data rates of 10 Gb/s and beyond and operating frequencies of greater than one gigahertz) with reduced signal loss.

Figure 1:
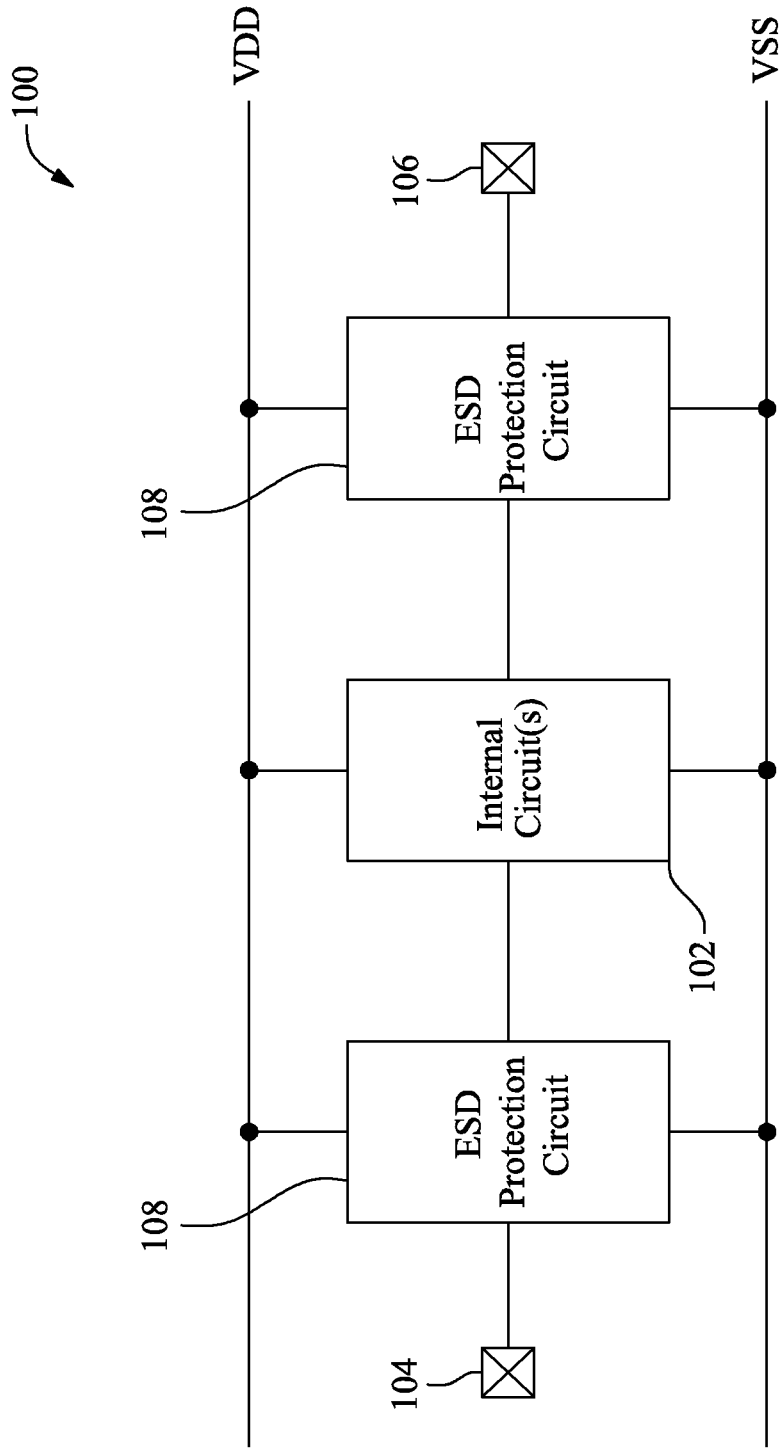
FIG. 1 illustrates a block diagram of an integrated circuit including internal circuitry and ESD protection circuitry.

FIG. 1 illustrates an integrated circuit 100 including an internal circuitry 102 disposed between an input pad 104, and an output pad 106. ESD protection circuitry 108 is disposed between the internal circuit(s) 102 and the input pad 104 as well as between the internal circuit(s) 102 and the output pad 106.

Figure 2:
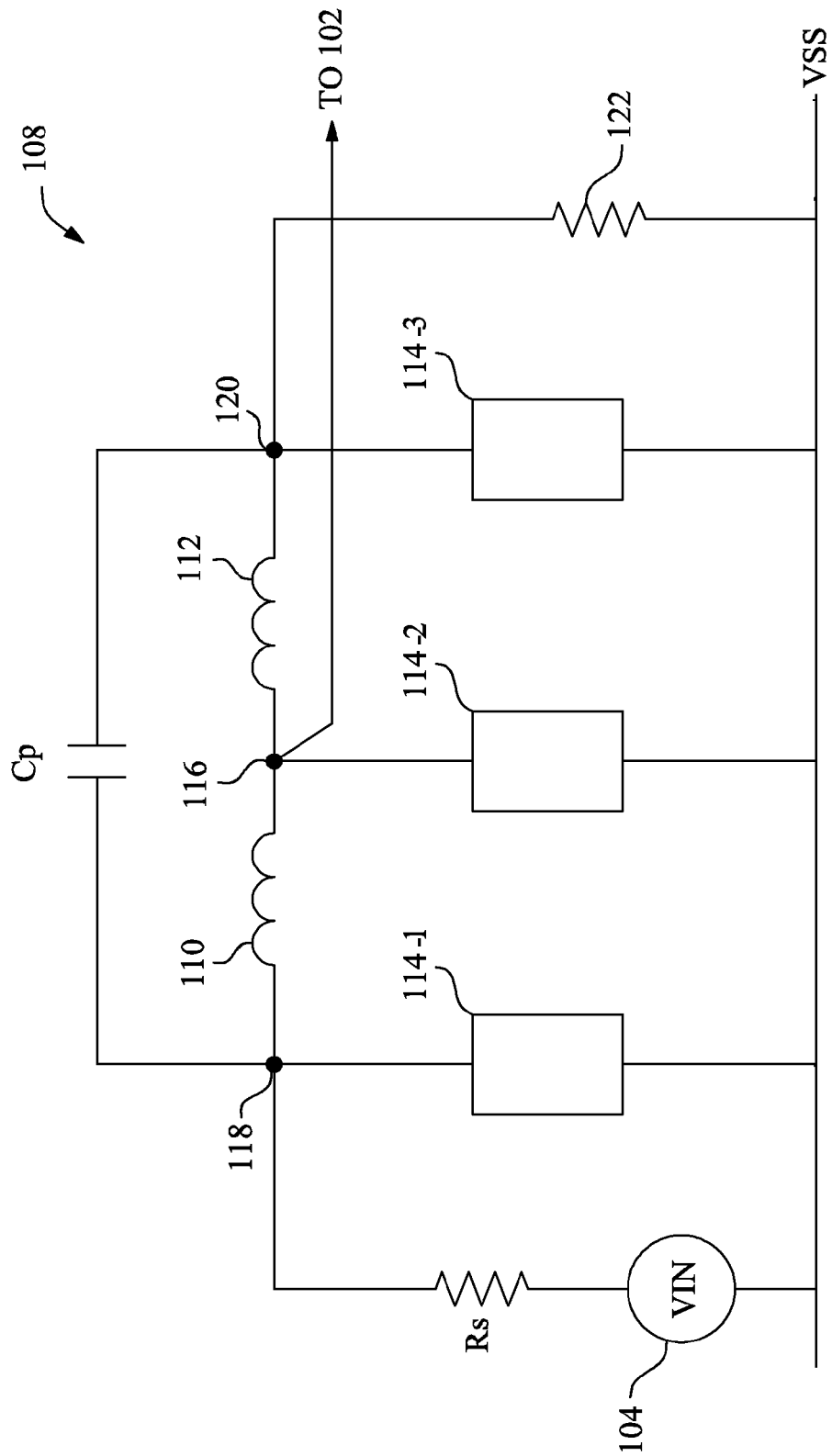
FIG. 2 illustrates one example of an improved ESD protection circuit.

FIG. 2 illustrates one example of the equivalent circuit of an improved ESD protection circuit 108. As shown in FIG. 2, ESD protection circuit 108 includes a pair of inductors 110, 112 and a plurality of distributed protection devices 114-1, 114-2, and 114-3 ("protection devices 114") coupled to inductors 110, 112 and disposed in parallel with one another and with a resistance 122. In particular, inductor 110 is coupled to inductor 112 at node 116, which is also coupled to protective device 114-2 and serves as the output node of protection circuit 108. Inductor 110 is also coupled to receive input voltage, VIN, from voltage source node 104 through a resistance, Rs, which may be the poly or substrate resistance as described in more detail below. Protection device 114-1 is coupled to node 118, which is also coupled to inductor 110. Inductor 112 is coupled to node 120, which is coupled to protection device 114-3 and to a resistor 122. A parasitic capacitance Cp is coupled to nodes 118 and 120 in parallel with inductors 110 and 112. Although three distributed protection devices 114 are shown in FIG. 2, one skilled in the art will understand that fewer or more protection devices 114 may be implemented.

Protection devices 114 may be implemented as a variety of devices having different capacitances. For example, protection devices 114 may be implemented as a diode, a n-type metal oxide semiconductor (NMOS) transistor having its gate grounded (GGNMOS), or as a silicon-controlled rectifier (SCR), to name a few examples. In some embodiments, protection devices 114 are implemented such that the protection device directly coupled to output node 116, e.g., protection device 114, has a greater capacitance than the other protection devices, e.g., protection devices 114-1 and 114-3. One skilled in the art will understand that other designs may be implemented such that each of the protection devices 114 are of equal capacitance or other protection devices 114 have greater capacitances than the protection device directly coupled to output node 116.

FIG. 3A is a cross-sectional view of one example of a diode 200 that may be implemented as a protection device 114. As shown in FIG. 3A, diode 200 may include a p-type substrate 202 in which p-well 204 is formed. Although diode 200 is described as being formed in a p-type substrate 202 and a p-well 204, one skilled in the art will understand that diode 200 may be formed in n-type substrates and n-wells.

A doped N+ area 206 and a doped P+ area 208 are formed in an upper surface of p-well 204 and are separated by shallow-trench isolation regions 210 that are formed in the upper area of p-well 204 and p-type substrate 202. N+ area 206 is configured to operate as the cathode of diode 200, and P+ area 208 is configured to operate as the anode of diode 200 such that current flows from P+ area 208 to N+ area 206.

FIG. 3B is a cross-sectional view of an example of a GGNMOS 220 that may be implemented as a protection device 114. As shown in FIG. 3B, GGNMOS 220 includes a p-type substrate 222 in which p-well 224 is formed. Although GGNMOS 220 is described as being formed in a p-type substrate 222 and a p-well 224, one skilled in the art will understand that GGNMOS 220 may be formed in n-type substrates and n-wells.

A pair of N+ regions 226 and a P+ region 228 are formed in an upper surface of p-well 224. The N+ regions 226 are separated from P+ region 228 by STI regions 230. A gate 232 is formed over p-well 224 between N+ region 226. Gate 232 is coupled to one of the N+ areas 226 and to P+ region at node 234, which is coupled to ground, GND. Within well 224, the structure of GGNMOS 220 forms a bipolar junction transistor ("BJT") 236 having its collector and emitter coupled to N+ areas 226 and its base coupled to P+ region 228 through p-well 226 having a resistance represented by resistor 238.

FIG. 3C is a cross-sectional view of an SCR 250 that may be used as a protection device 114. As shown in FIG. 3C, SCR 250 includes a p-type substrate 252 in which a p-well 254 and an n-well 256 are formed. Although SCR 250 is described as being formed in a p-type substrate 252 and a p-well 254, one skilled in the art will understand that SCR 250 may be formed in n-type substrates and n-wells.

N+ area 258-1 and P+ area 260-1 are formed in the upper surface of n-well 256, and N+ area 258-2 and P+ area 260-2 are formed in the upper surface of p-well 254. STI regions 262 are formed in the upper areas of p-well 254 and n-well 256 and are disposed between adjacent N+ regions 258 and P+ regions 260. N+ region 258-1 and P+ region 260-1 are coupled together at node 264, and N+ region 256-2 and P+ region 258-2 are coupled together at node 266.

A BJT 270 is effectively formed within p-well 254 with N+ areas 258 serving as the collector and emitter contacts of BJT 270 and P+ area 260-2 serving as the base contact of BJT 270. BJT 272 is effectively formed within n-well 256 with P+ areas 260 serving as the collector and emitter contacts and N+ area 258-1 serving as the base contact. The poly or substrate resistances are shown as resistors 272 and 274.

Figure 4A:
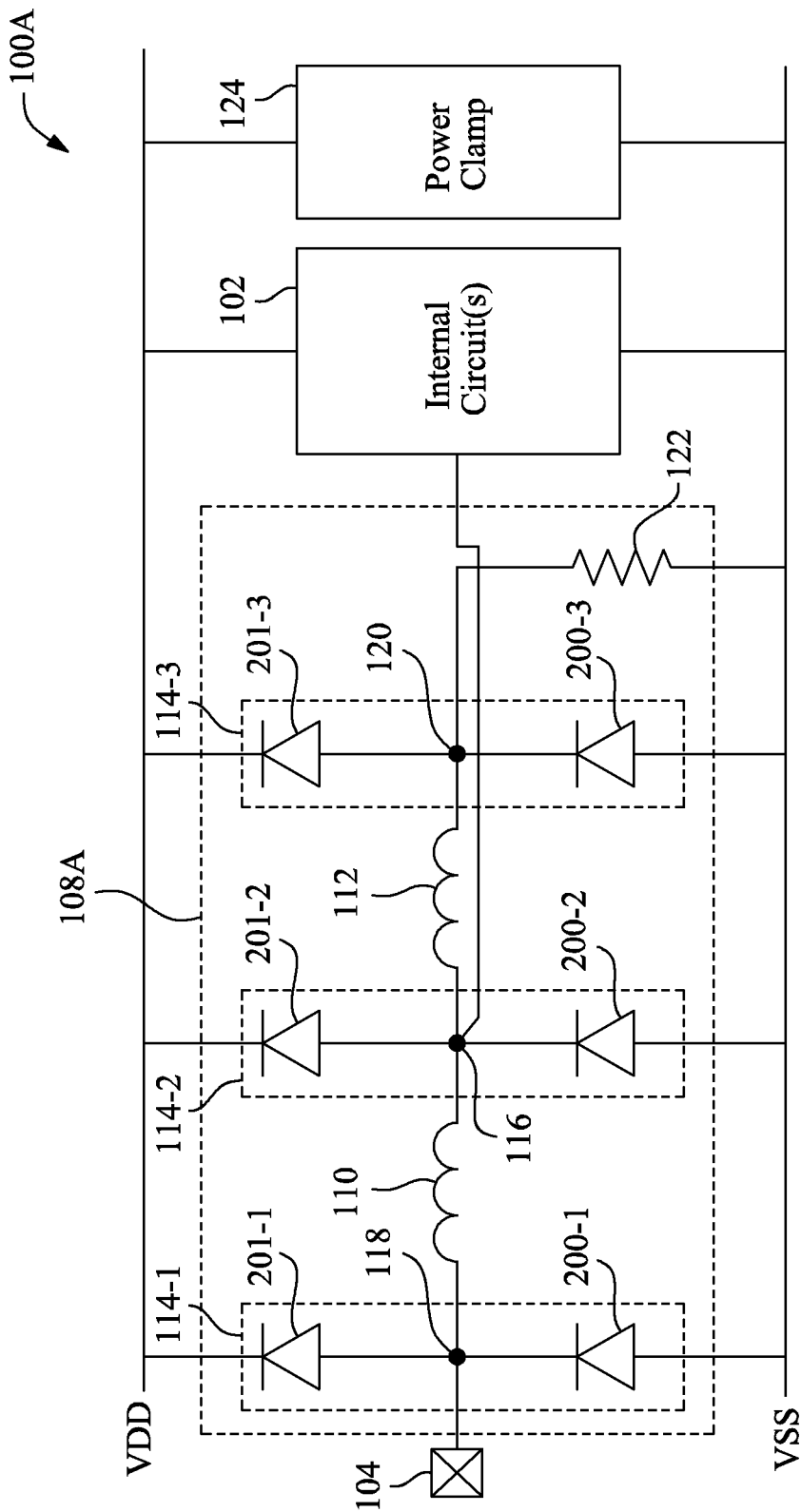
FIG. 4A-4C illustrate embodiments of ESD protection circuits in accordance with the ESD protection circuit illustrated in FIG. 2 and the protection devices illustrated in FIGS. 3A-3C.

FIG. 4A illustrates one example of an integrated circuit 100A that includes ESD protection circuitry 108 in which protection devices 114 include diodes 200 as shown in accordance with FIG. 3A. Integrated circuit 100A includes internal circuit(s) 102 coupled between high and low power supply rails or nodes, which may be respectively set at VDD and VSS. Internal circuit(s) 102 receives an input signal from input terminal 104, which is coupled to internal circuit(s) through ESD protection circuit 108A. An ESD power clamp 124 may be coupled in parallel with internal circuit(s) 102 between the high and low power supply nodes.

ESD protection circuit includes inductors 110 and 112 that are coupled together in series. Inductor 110 is coupled to node 118, which is coupled to input terminal 104 and to diodes 200-1 and 201-1 of protection device 114-1. In particular, the anode of diode 200-1, e.g., P+ region 208, is coupled to VSS, and the cathode of diode 200-1, e.g., N+ region 206, is coupled to node 118. Node 118 is also coupled to the anode of diode 201-1, which has its cathode coupled to VDD. Diode 201-1 may have a cross-sectional area that is similar to the cross-sectional area of diode 200 shown in FIG. 3A except that diode 201 is configured as a p-type diode whereas diode 200 is configured as an n-type diode as will be understood by one skilled in the art.

Inductor 110 is coupled to inductor 112 at node 116, which is also coupled to diodes 200-2, 201-2 of protection device 114-2 and to internal circuit(s) 102. Diode 200-2 has its anode coupled to VSS and its cathode coupled to node 116, and diode 201-2 has its anode coupled to node 116 and its cathode coupled to VDD.

Inductor 112 is also coupled to node 120 to which diodes 200-3 and 201-3 of protection device 114-3 and resistor 122 are coupled. The anode of diode 200-3 is coupled to the low voltage supply set at VSS, and the cathode of diode 200-3 is coupled to node 120. The anode of diode 201-3 is coupled to node 120, and the cathode of diode 201-3 is coupled to the high voltage power supply set at VDD. Resistor 122 is coupled to node 120 and to VSS in parallel with diode 200-3.

Figure 4B:
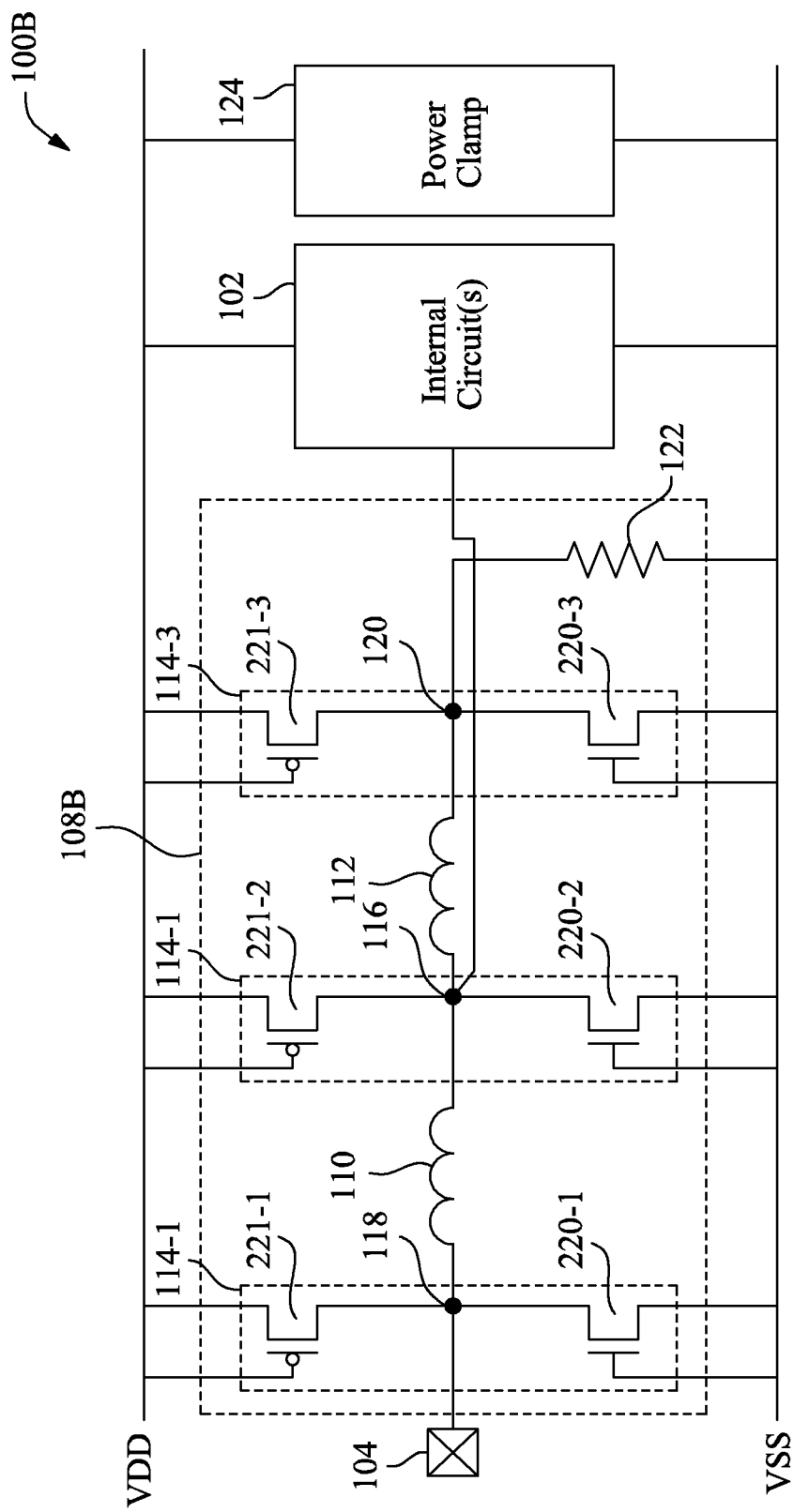

FIG. 4B illustrates one example of an integrated circuit 100B that includes ESD protection circuitry 108 in which protection devices 114 include transistors 220, 221. Integrated circuit 100B includes internal circuit(s) 102 coupled between high and low power supply rails, which may be respectively set at VDD and VSS. Internal circuit(s) 102 receives an input signal from input terminal 104, which is coupled to internal circuit(s) through ESD protection circuit 108B. An ESD power clamp 124 may be coupled in parallel with internal circuit(s) 102 between the high and low power supply nodes.

Transistor 220-1 of protection device 114-1 is an NMOS transistor in accordance with FIG. 3B having its source and gate, e.g., node 234 in FIG. 3B, both coupled to VSS. The drain of transistor 220-1, e.g., N+ region 226, is coupled to node 118, which is coupled to input node 104, transistor 221-1, and node 116. Transistor 221-1 of transistor 114-1 is a PMOS transistor having a similar cross-sectional configuration as transistor 220-1 shown in FIG. 3B except that transistor 221-1 is configured as a PMOS instead of as an NMOS transistor. The drain of transistor 221-1 is coupled to node 118, and the source and gate of transistor 221-1 are coupled to VDD.

Inductors 110 and 112 are coupled together at node 116, which is also coupled to transistors 220-2, 221-2 of protection device 114-2 and to internal circuit(s) 102. Transistor 220-2 has its source and gate coupled to ground or VSS and its drain coupled node 116. The gate and source of transistor 221-2 are both coupled to VDD, and the drain of transistor 221-2 is coupled to node 116. Node 120 is coupled to resistor 122, to the drains of transistors 220-3 and 221-3 of protection device 114-3. The source and gate of transistor 220-3 are coupled to a low voltage supply, such as VSS or ground, and the source and gate of transistor 221-3 are coupled to a high voltage supply, such as to VDD.

Figure 4C:
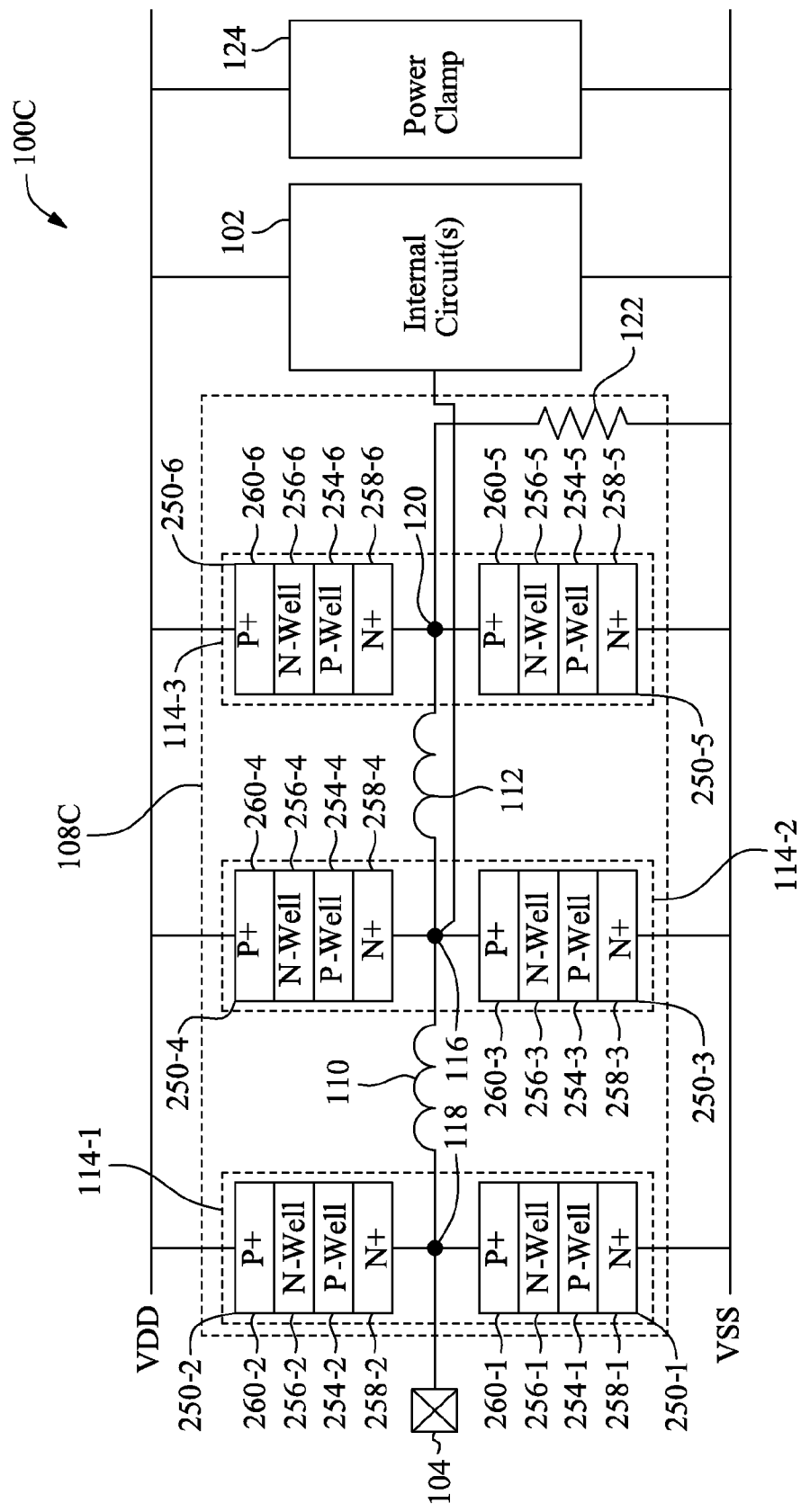

FIG. 4C illustrates one example of an integrated circuit 100C that includes ESD protection circuitry 108 in which protection devices 114 include SCRs 250 in accordance with FIG. 4C. As shown in FIG. 4C, SCRs 250-1 and 250-2 of protection device 114-1 are coupled to node 118 to which input terminal 104 and inductor 110 are coupled. An ESD power clamp 124 may be coupled in parallel with internal circuit(s) 102 between the high and low power supply nodes.

N+ region 258-1 of SCR 250-1 is coupled to VSS and to p-well 254-1, which is also coupled to n-well 256-1. P+ region 260-1 of SCR 250-1 is coupled to n-well 256-1 and to node 118. SCR 250-2 has an N+ region 258-2 coupled to node 118 and to p-well 254-2. P-well 254-2 is coupled to P+ region 260-2 through n-well 256-2. P+ region is coupled between n-well 256-2 and VDD.

Inductor 110 is coupled to inductor 112 at node 116 to which SCR 250-3, SCR 250-4 of protection device 114-2, and internal circuit(s) 102 are coupled. SCR 250-3 is disposed between VSS and node 116 such that N+ region 258-3 is coupled to VSS and to p-well 254-3. N-well 256-3 is coupled such that it is disposed between p-well 254-3 and P+ region 260-3, which is coupled to node 116. SCR 250-4 is configured such that N+ region 116 is directly coupled to node 116 and to p-well 254-4 and P+ region 260-4 is directly coupled to VDD and to n-well 256-4.

Inductor 112, SCRs 250-5 and 250-6 of protection device 114-3, and resistor 122 are coupled together at node 120. Node 120 is coupled to ground through P+ region 260-5, n-well 256-5, p-well 254-5, and N+ region 258-5 of SCR 250-5. N+ region 258-6 of SCR 250-6 is coupled between node 120 and p-well 254-6 of SCR 250-6. N-well 256-6 is disposed between p-well 254-6 and P+ region 260-6, which is coupled to VDD.

Although FIGS. 4A-4C illustrate embodiments in which each ESD protection device 114 is implemented as a same type of protection device, e.g., as diodes 200, transistors 220, or as SCRs 250, one skilled in the art will understand that ESD protection circuit 108 may include different types of protection devices 114, e.g., as diodes 200, transistors 220, and/or SCRs 250. The operation of the integrated circuit 100 including improved ESD protection circuit 108 is described with reference to FIG. 5, which is a flow diagram of one example of a method 500 of providing ESD protection.

At block 502, an oscillating or periodic input signal (e.g., a radio frequency "RF" signal) is received at input node 104. During normal high-frequency operation (e.g., frequencies at or above 1 GHz) at block 504, the oscillating input signal is passed to internal circuit(s) 102 with reduced signal loss attributable to ESD protection circuitry.

At block 506, ESD protection circuitry provides a pathway for ESD current to flow to ground away from internal circuit(s) 102. As will be understood by one skilled in the art, the high current generated in response to an ESD event between power rails VDD and VSS is channeled away from internal circuit(s) by ESD protection devices 114.

The improved signal loss characteristics provided by ESD protection circuit 108 is apparent in the various eye diagrams shown in FIGS. 6A-6D and 7A-7D. The eye diagram shown in FIG. 6A was obtained in response to a data rate of 40 Gb/s second being received at node 116 with the capacitance across ESD protection device 114-1, $C_{114-1}$, being 50 fF, the capacitance across ESD protection device or internal circuit 114-2, $C_{114-2}$, being 300 fF, and the capacitance across ESD protection device 114-3, $C_{114-3}$, being 50 fF such that the total capacitance, $C_{total}$, is 400 fF. Accordingly, the capacitance of protection device 114-2 directly coupled to output node 116 is greater than a capacitance of protection device 114-1 and protection device 114-3, which are respectively coupled to output node 116 through inductors 110 and 112. The eye of FIG. 6A has a width of 24 ps and a height of 0.35 V.

Figure 6B:
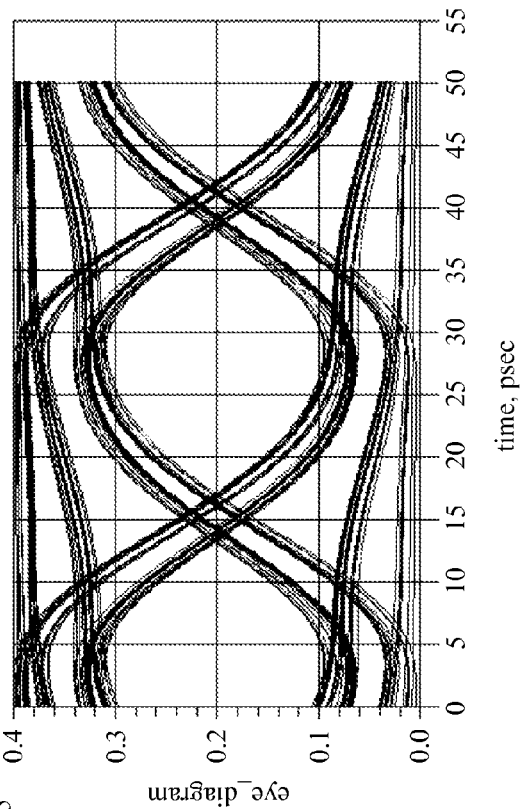
FIGS. 6A-6D are eye diagrams generated in response to a signal received at a first data rate when ESD protection devices have various capacitances.
Figure 6A:
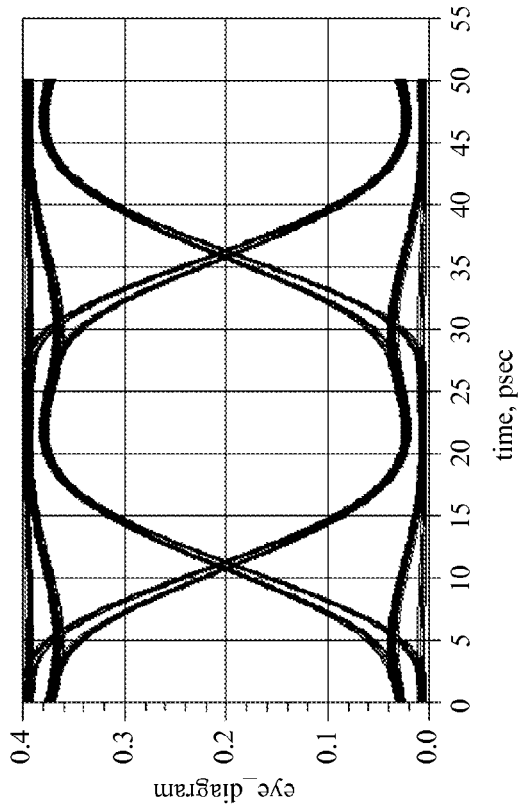

The eye diagram shown in FIG. 6B was obtained using the same data rate as the data rate used to generate the eye diagram in FIG. 6A (i.e., 40 Gb/s) and doubling the capacitance values of protection devices 114. The width of the eye in FIG. 6B is approximately 20.8 ps with a height of approximately 0.21 V with, $C_{114-1}$=100 fF, $C_{114-2}$=600 fF, $C_{114-3}$=100 fF, and $C_{total}$=800 fF.

Figure 6D:
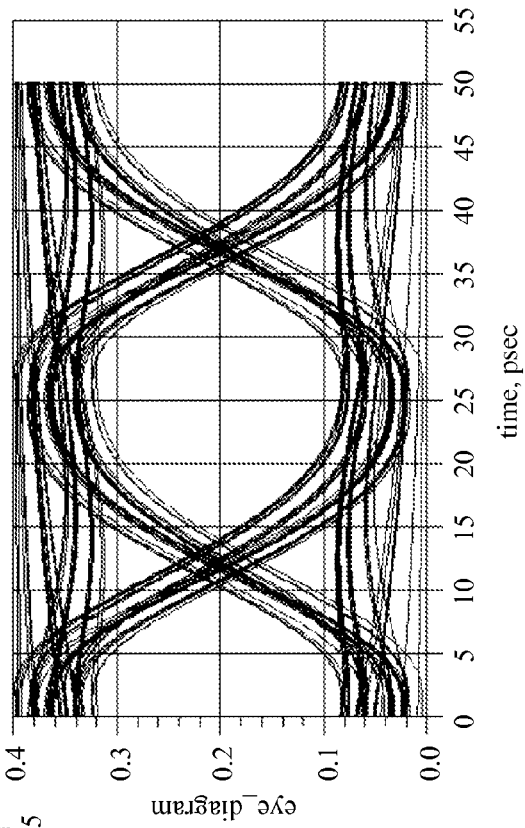
Figure 6C:
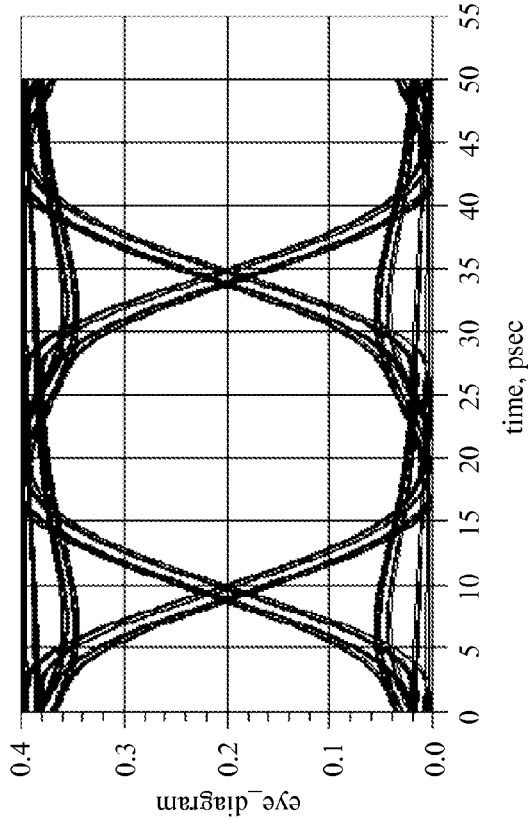

FIGS. 6C and 6D are eye diagrams obtained with the same total capacitances as the capacitances in FIGS. 6A and 6B, respectively, i.e., $C_{total}$=400 fF and $C_{total}$=800 fF, but with different distributions of the capacitances, in response to a signal received with the same data rate (i.e., 40 Gb/s). For example, the eye diagram in FIG. 6C was generated with $C_{total}$=400 fF with $C_{114-1}$=0 fF, $C_{114-2}$=300 fF, and $C_{114-3}$=100 fF, and the eye diagram in FIG. 6D was generated with $C_{total}$=800 fF with $C_{114-1}$=0 fF, $C_{114-2}$=600 fF, and $C_{114-3}$=200 fF. The width of the eye in FIG. 6C is approximately 24 ps with a height of approximately 0.35 V, and the width of the eye in the eye diagram shown in FIG. 6D is approximately 21.3 ps with a height of 0.24 V.

Figure 7B:
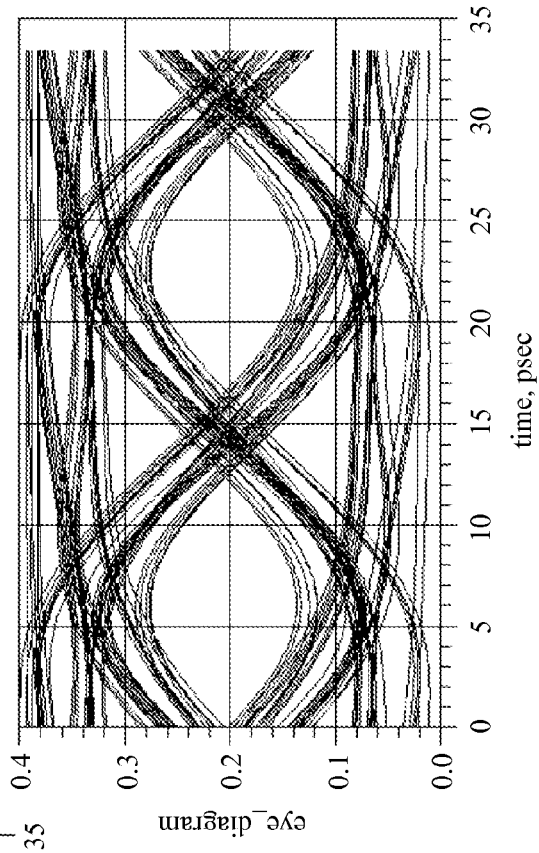
Figure 7A:
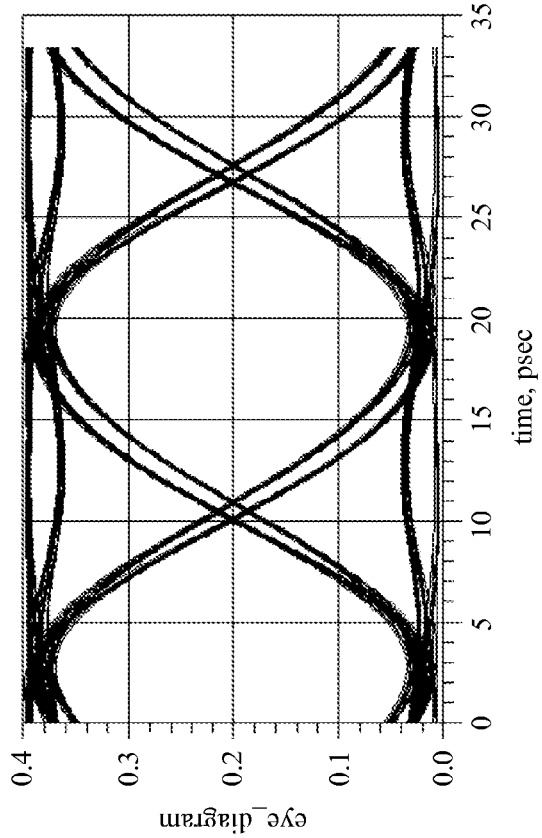

The eye diagrams in FIGS. 7A-7D have the same respective capacitance and capacitance distributions as their counterparts in FIGS. 6A-6D, but are generated at node 116 in response to a data rate of 60 Gb/s. Referring first to FIG. 7A, the eye of the eye diagram has a width of 15.5 ps and a height of 0.33 V with $C_{total}$=400 fF when $C_{114-1}$=50 fF, $C_{114-2}$=300 fF, and $C_{114-3}$=50 fF. When the capacitances of the ESD protection devices 114 are doubled, i.e., $C_{114-1}$=100 fF, $C_{114-2}$=600 fF, and $C_{114-3}$=100 fF, the width of the eye of the eye diagram in FIG. 7B is approximately 12.3 ps and the height of the eye is approximately 0.14 V.

The eye diagram in FIG. 7C, which is generated with $C_{114-1}$=0 fF, $C_{114-2}$=300 fF, and $C_{114-3}$=100 fF, has a width of 15.7 ps and a height of –0.3 V. When the capacitances of ESD protection devices 114 are doubled, i.e., $C_{114-1}$=0 fF, $C_{114-2}$=600 fF, and $C_{114-3}$=200 fF, the width of the eye is approximately 13.2 ps and the height of the eye is approximately 0.2 V.

As described above, the improved ESD circuits advantageously protect high-speed circuits (e.g., circuits having data rates of 10 Gb/s and beyond and operating frequencies of greater than one gigahertz) with reduced signal loss.

Figure 8:
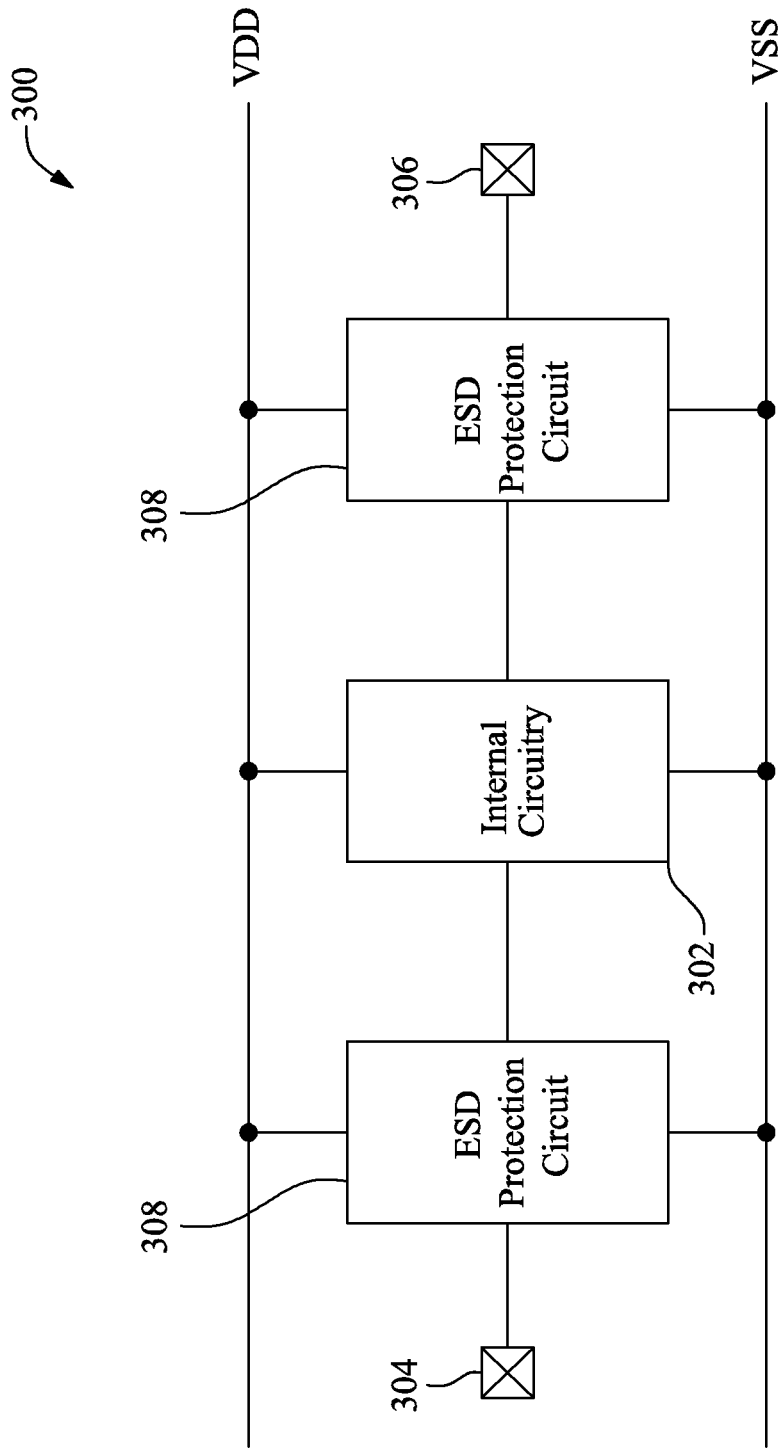
FIG. 8 illustrates another example of an integrated circuit including internal circuitry and ESD protection circuitry in accordance with some embodiments.

FIG. 8 illustrates another example of an integrated circuit 300 including internal circuitry 302 disposed between an input pad 304, and an output pad 306. ESD protection circuitry 308 is disposed between the internal circuitry 302 and the input pad 304 as well as between the internal circuitry 302 and the output pad 306.

Figure 9:
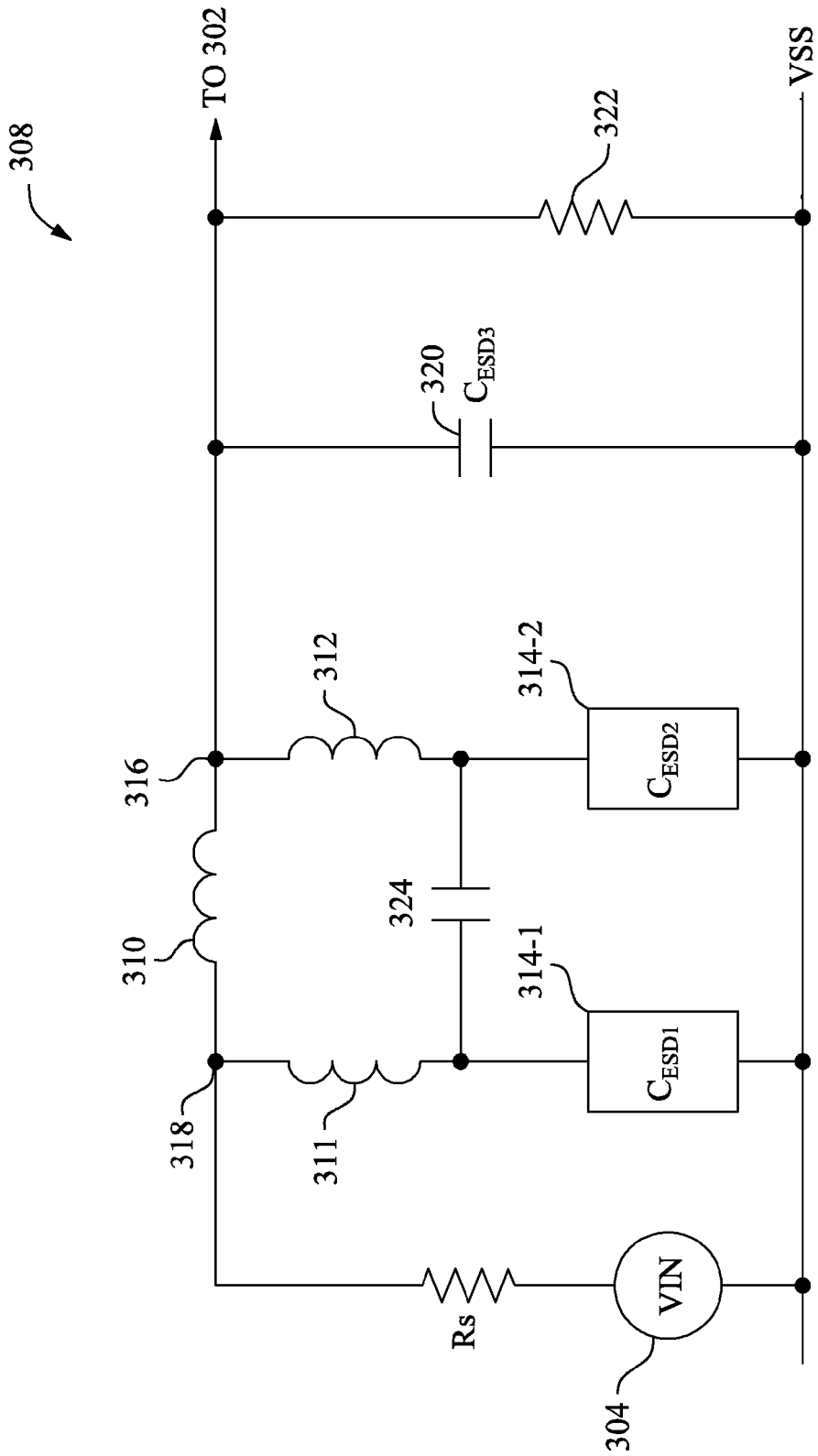
FIG. 9 illustrates one example of a pi-coil ESD protection circuit in accordance with some embodiments.

Turning now to FIG. 9, one example of a pi-coil ESD protection circuit 308 in accordance with some embodiments is illustrated. As shown in FIG. 9, ESD protection circuit 308 includes inductors 310, 311, and 312 arranged in a pi configuration. For example, the ESD protection circuit 308 is referred to herein as a "pi-coil" due to the similar appearance of the three inductors in the circuit diagram of the protection circuit 308 and the roman character pi. More particularly, inductors 310 and 311 are coupled together at node 318, which is also coupled to input node 304 through a through a resistance, Rs, which may be the poly or substrate resistance. Other types of resistance are within the contemplated scope of the present disclosure. Node 318 is configured to receive the input voltage, VIN, through resistance Rs. Inductors 310 and 312 are coupled together at node 116, which is also coupled to capacitor 320 and to resistor 322 that are disposed in parallel with one another. In some embodiments, capacitor 320 represents a parasitic capacitance and is not a fabricated structure. In some embodiments, capacitor is a fabricated structure.

Inductors 311 and 312 are each coupled to VSS (or ground) through a respective protection device 314-1 and 314-2 ("protection devices 314"). Protections devices 314, like protection devices 114 described above, can take a variety of forms including, but not limited to, a diode, a GGNMOS, and an SCR. The specific implementations of protection devices 314 are in accordance with those devices described above with respect to FIGS. 3A-3C. In some embodiments, protection device 314-1 has a capacitance equal to a first induced ESD parasitic capacitance, $C_{ESD1}$, and protection device 314-2 has a capacitance equal to the sum of a second ESD parasitic capacitance, $C_{ESD2}$, and the capacitance of ESD protection circuit 308. Capacitor 320, in some embodiments, has a capacitance equal to a third ESD parasitic capacitance, $C_{ESD3}$, or is a parasitic capacitance and not a fabricated structure. In some embodiments, the values of $C_{ESD1}$, $C_{ESD2}$, and $C_{ESD3}$ are designed along with the values of inductors 310, 311, and 312. For example, the ESD protection circuit 308 can be simulated using a simulator or an EDA tool such as, for example, "IC COMPILER"™ sold by Synopsys, Inc. of Mountain View, Calif., or a design tool such as the "VIRTUOSO" custom design platform or the Cadence "Encounter"® digital IC design platform sold by Cadence Design Systems, Inc. of San Jose, Calif. Capacitor 324 is shown as being coupled to nodes 326 and 328, with node 326 being coupled between inductor 311 and protection device 314-1 and node 328 being coupled between inductor 312 and protection device 314-2. In some embodiments, however, capacitor 324 represents a parasitic capacitance and not a fabricated structure, although capacitor 324 can be a fabricated structure.

Figure 10:
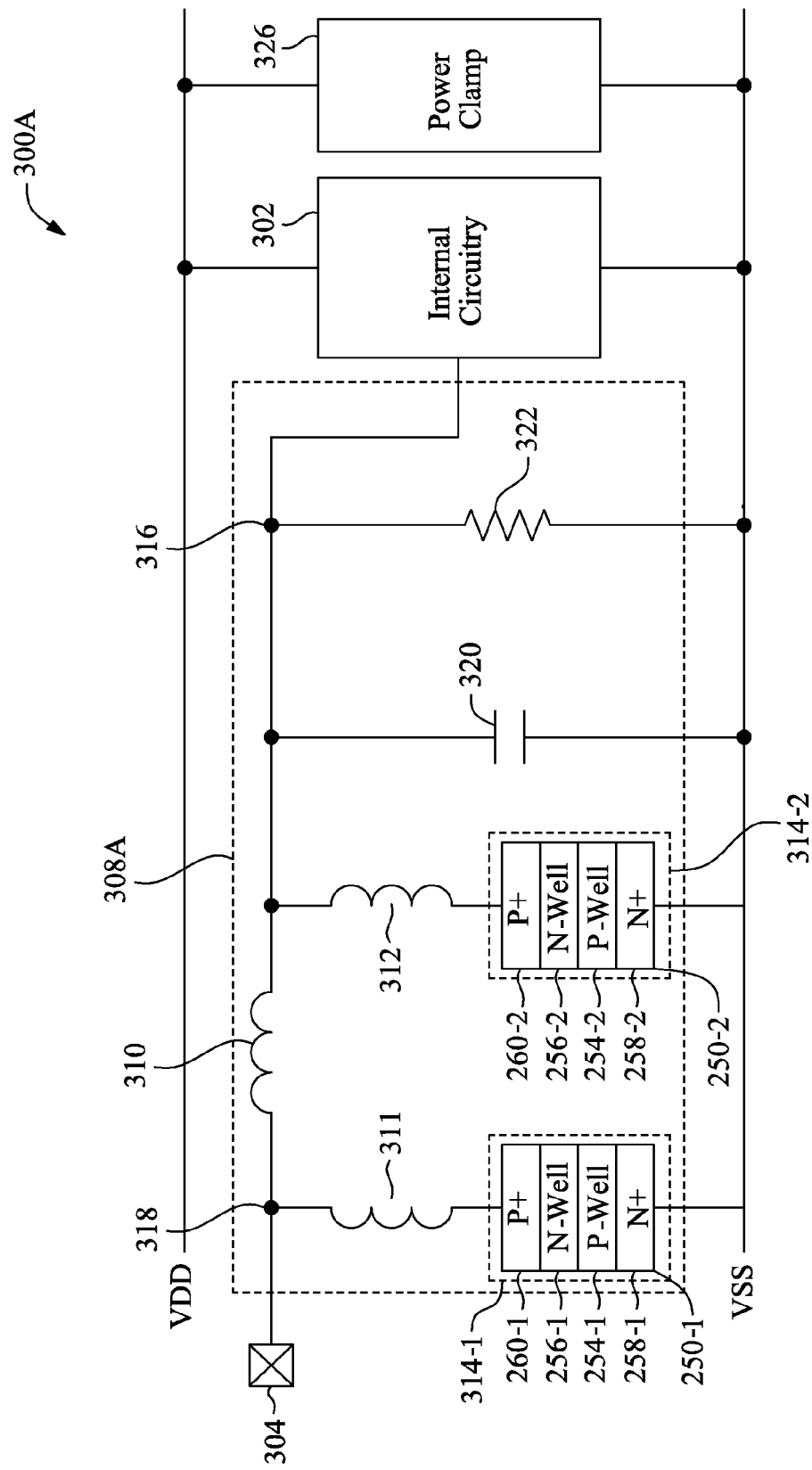
FIG. 10 illustrates one example of an integrated circuit including internal circuitry and pi-coil ESD protection circuitry in accordance with some embodiments.

FIG. 10 illustrates one example of an integrated circuit configured with a pi-coil ESD configuration in accordance with some embodiments. As shown in FIG. 10, integrated circuit 300A includes internal circuitry 302, an input node, and a pi-coil ESD protection circuit 308A coupled between internal circuitry 302 and input node 304. A power clamp 326 is shown as being disposed in parallel with internal circuitry 302.

Input node 304 is coupled to inductors 310 and 311 at node 318. Inductor 311 is coupled to protection device 314-1, which is shown as being implemented as an SCR 250-1. In some embodiments, inductor 311 is coupled to P+ region 260-1, which is coupled to n-well 256-1. P-well 254-1 is coupled to N+ region 258-1, which is coupled to VSS. Inductor 310 is coupled to node 316, which serves at the output node of ESD protection circuit 308A and is coupled to internal circuitry 302. Capacitor 320 and resistor 322 are disposed in parallel with each other and each coupled to VSS and to node 316.

Protection device 314-2 is coupled between inductor 312 and VSS. As shown in FIG. 10, protection device 314-2 is implemented as an SCR 250-2 such that a P+ region 260-2 is coupled to inductor 312. P+ region 260-2 is coupled to n-well 256-2, which is disposed adjacent to p-well 254-2. An N+ region 25-2 is disposed adjacent to p-well 254-2 and is coupled to VSS. Although protection devices 314 are shown as SCRs in FIG. 10, the disclosure is not limited and protection devices 314 can be implemented as other devices including, but not limited to, a diode or an GGNMOS to list just a couple of examples.

Figure 11:
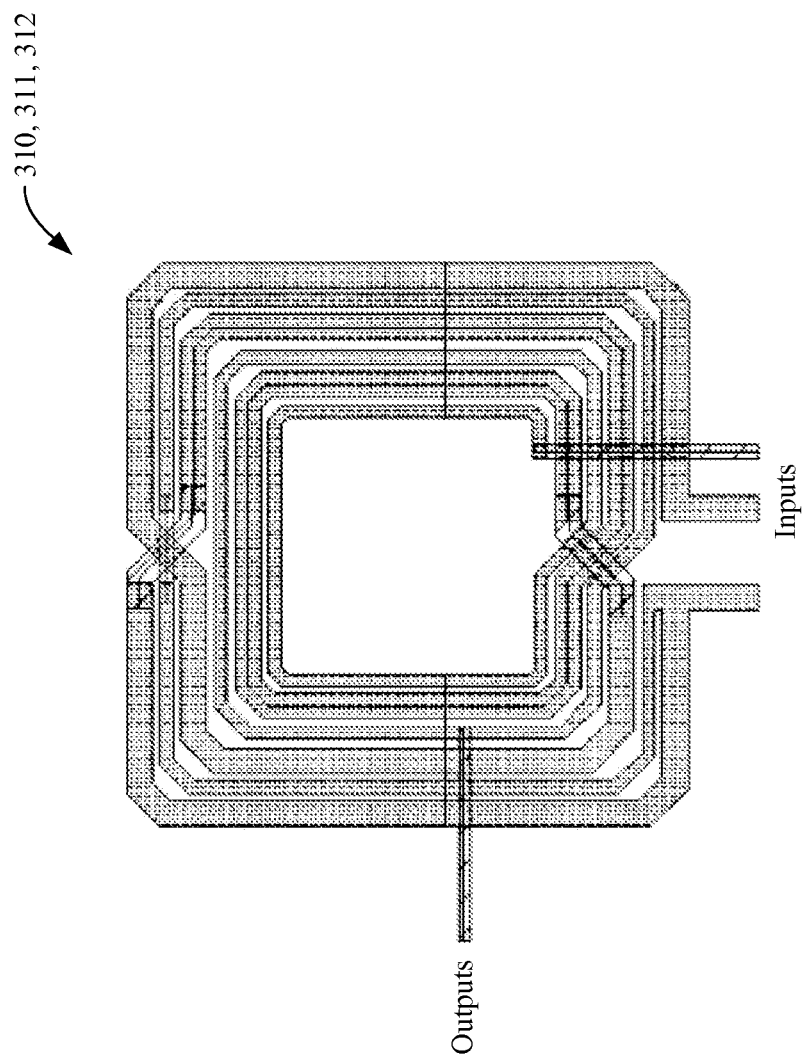
FIG. 11 is a layout of one example of a pi-coil in accordance with some embodiments.

FIG. 11 illustrates one example of inductors 310, 311, 312 in a layout view. As shown in FIG. 11, inductors 310, 311, 312 are coiled about one another with the inputs (or first ports) disposed along a first side of the coil and the outputs (or second ports) extending from a second side of the coil. The number of coils or turns can be varied as will be understood by one of ordinary skill in the art.

Figure 5:
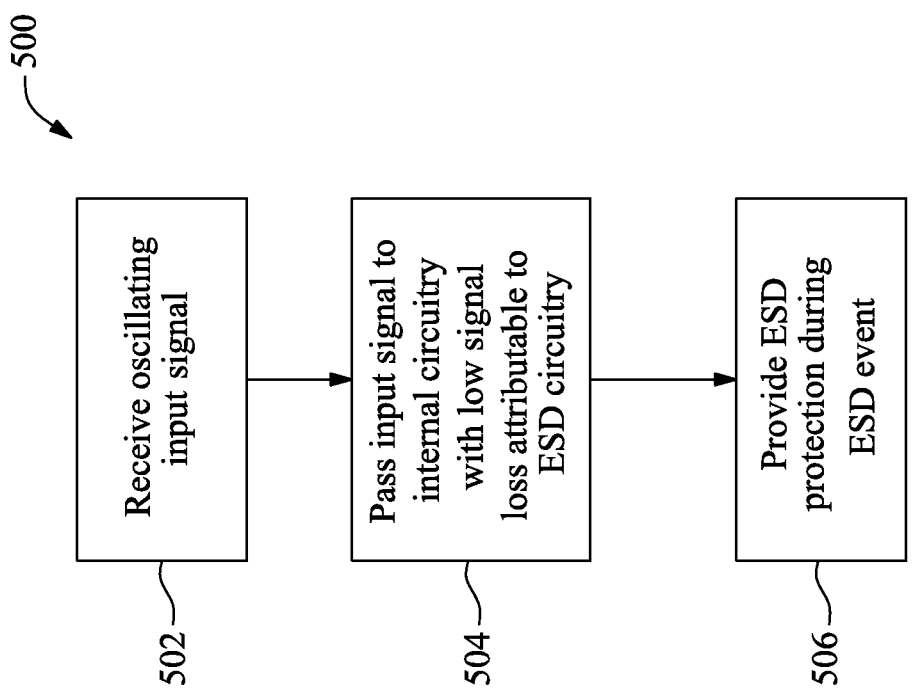
FIG. 5 is a flow diagram of one example of a method of providing ESD protection.

The operation of integrated circuit 300A with pi-coil ESD protection circuit 308A is described with reference to FIG. 5. At block 502, an oscillating or periodic input signal (e.g., an RF signal) is received at input node 304. During normal high-frequency operation (e.g., frequencies at or above 1 GHz) at block 504, the oscillating input signal is passed to internal circuitry 302 with reduced signal loss attributable to ESD protection circuitry 308A. For example, the value of inductors 310, 311, and 312 are selected such that during the high-frequency operation inductor 310 appears as a short circuit and inductors 311 and 312, in combination with protection devices 314-1 and 314-2, respectively, appear as open circuits such that the oscillating input signal is passed from node 318 to node 316 with little signal loss.

At block 506, ESD protection circuitry provides a pathway for ESD current to flow to ground (VSS) away from internal circuitry 302. As will be understood by one skilled in the art, the high current generated in response to an ESD event between power rails VDD and VSS is channeled away from internal circuitry 302 by ESD protection devices 314 in multiple directions. For example, during an ESD event at input node 304, ESD current can be passed through inductor 311 and protection device 314-1 to VSS, as these devices combine to effectively provide a short circuit to ground, and/or through inductors 310 and 312 and through protection device 314-2 as these devices effectively provide a short circuit to ground. For ESD events at node 316, the ESD current is channel away from internal circuitry 302 through inductor 312 and protection device 314-2 and/or through inductors 310 and 311 and protection device 314-1.

In some embodiments, an electrostatic discharge protection circuit includes an input node coupled to receive an input signal and an output node coupled to output the input signal to an internal circuit. A first inductor is coupled to the input node and to the output node, and a second inductor is coupled to the output node and to a first power supply node through a resistance. A plurality of protection devices are coupled to the first and second inductors and are disposed in parallel with each other.

In some embodiments, a method includes receiving an oscillating signal at an input node coupled to an electrostatic discharge protection. The electrostatic discharge protection circuit includes a first inductor coupled to the input node and to an output node, a second inductor coupled to the output node and to a first power supply node through a resistance, and a plurality of protection devices coupled to the first and second inductors and disposed in parallel with each other. The input signal is output to a circuit coupled to the output node. A channel is provided to channel for current away from the circuit during an electrostatic discharge event.

In some embodiments, an integrated circuit includes internal circuitry, an input node for receiving an input signal, and an electrostatic discharge circuit coupled between the internal circuitry and the input node. The electrostatic discharge circuit is configured to channel for current away from the internal circuitry during an electrostatic discharge event and includes a first inductor coupled to the input node and to an output node that is coupled to the internal circuitry, a second inductor coupled to the output node and to a first power supply node through a resistance, and a plurality of protection devices coupled to the first and second inductors and disposed in parallel with each other.

In some embodiments, an electrostatic discharge (ESD) protection circuit includes a first inductor coupled to an input node configured to receive an input signal and to an output node. A second inductor is coupled to the input node and to a first ESD protection device, and a third inductor is coupled to the output node and to a second ESD protection device.

In some embodiments, a method includes receiving an oscillating signal at an input node coupled to an electrostatic discharge (ESD) protection circuit, outputting the input signal to circuitry coupled to an output node, and providing a channel for current away from the circuitry during an ESD event. The ESD protection circuit includes a first inductor coupled to the input node to an output node coupled to circuitry, a second inductor coupled to the input node and to a first ESD protection device, and a third inductor coupled to the output node and to a second ESD protection device.

In some embodiments, an integrated circuit includes circuitry and an electrostatic discharge (ESD) protection circuit. The ESD protection circuit includes a first inductor coupled to an input node configured to receive an input signal and to an output node coupled to the circuitry, a second inductor coupled to the input node and to a first ESD protection device, and a third inductor coupled to the output node and to a second ESD protection device. The second inductor is disposed in series with the first ESD protection device, and the third inductor is disposed in series with the second ESD protection device.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An electrostatic discharge (ESD) protection circuit comprising:
   a first inductor coupled to an input node and to an output node, the input node configured to receive an input signal and the output node;
   a second inductor coupled between the input node and a first ESD protection device; and
   a third inductor coupled between the output node and a second ESD protection device.

2. The ESD protection circuit of claim 1, wherein the first and second ESD protection devices are coupled to a first power supply.

3. The ESD protection circuit of claim 1, wherein the first ESD protection device includes at least one of a diode, a transistor, or a silicon-controlled rectifier.

4. The ESD protection circuit of claim 1, wherein the second ESD protection device includes at least one of a diode, a transistor, or a silicon-controlled rectifier.

5. The ESD protection circuit of claim 4, wherein the first ESD protection device includes at least one of a diode, a transistor, or a silicon-controlled rectifier.

6. The ESD protection circuit of claim 1, further comprising a resistor coupled to the output node and to a first power supply.

7. The ESD protection circuit of claim 1, wherein the second inductor is disposed in series with the first ESD protection device, and the third inductor is disposed in series with the second ESD protection device.

8. A method, comprising:
   receiving an oscillating signal at an input node coupled to an electrostatic discharge (ESD) protection circuit comprising
      a first inductor coupled to the input node to an output node coupled to circuitry,
      a second inductor coupled between the input node and a first ESD protection device, and
      a third inductor coupled between the output node and a second ESD protection device;
   outputting the input signal to the circuitry coupled to the output node; and
   providing a channel for current away from the circuitry during an ESD event.

9. The method of claim 8, wherein the second inductor is disposed in series with the first ESD protection device, and the third inductor is disposed in series with the second ESD protection device.

10. The method of claim 8, wherein the channel for current extends from the input node through the second inductor and the first ESD protection device.

11. The method of claim 8, wherein the channel for current extends from the input node through the first inductor, the third inductor, and the second ESD protection device.

12. The method of claim 8, wherein the first ESD protection device includes at least one of a diode, a transistor, or a silicon-controlled rectifier.

13. The method of claim 8, wherein the second ESD protection device includes at least one of a diode, a transistor, or a silicon-controlled rectifier.

14. The method of claim 13, wherein the first ESD protection device includes at least one of a diode, a transistor, or a silicon-controlled rectifier.

15. An integrated circuit, comprising:
   circuitry; and
   an electrostatic discharge (ESD) protection circuit including
      a first inductor coupled to an input node configured to receive an input signal and to an output node coupled to the circuitry,
      a second inductor coupled between the input node and a first ESD protection device, and
      a third inductor coupled between the output node and a second ESD protection device,
   wherein the second inductor is disposed in series with the first ESD protection device, and the third inductor is disposed in series with the second ESD protection device.

16. The integrated circuit of claim 15, wherein the first ESD protection device includes at least one of a diode, a transistor, or a silicon-controlled rectifier.

17. The integrated circuit of claim 15, wherein the second ESD protection device includes at least one of a diode, a transistor, or a silicon-controlled rectifier.

18. The integrated circuit of claim 17, wherein the first ESD protection device includes at least one of a diode, a transistor, or a silicon-controlled rectifier.

19. The integrated circuit of claim 15, wherein the first ESD protection device includes a first silicon-controlled rectifier comprising
   a first P+ region coupled to the second inductor,
   a first n-well coupled to the first P+ region,
   a first p-well coupled to the first n-well, and
   a first N+ region coupled to the p-well.

20. The integrated circuit of claim 19, wherein the second ESD protection device includes a second silicon-controlled rectifier comprising
   a second P+ region coupled to the third inductor,
   a second n-well coupled to the second P+ region,
   a second p-well coupled to the second n-well, and
   a second N+ region coupled to the second p-well.

21. The integrated circuit of claim 15, wherein the ESD protection circuit includes a resistor coupled to the output node and to a first power supply.

22. The integrated circuit of claim 21, wherein the ESD protection circuit includes a capacitor disposed in parallel with the resistor.

* * * * *